(12) United States Patent
Monfray et al.

(10) Patent No.: US 9,972,190 B2
(45) Date of Patent: May 15, 2018

(54) EVENT DETECTOR

(71) Applicant: STMicroelectronics (Crolles 2) SAS, Crolles (FR)

(72) Inventors: Stephane Monfray, Eybens (FR); Christophe Maitre, Barraux (FR); Thomas Skotnicki, Crolles-Montfort (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days. days.

(21) Appl. No.: 15/139,500

(22) Filed: Apr. 27, 2016

(65) Prior Publication Data

US 2017/0169696 A1  Jun. 15, 2017

(30) Foreign Application Priority Data

Dec. 15, 2015 (FR) ...................... 15 62409

(51) Int. Cl.
| G08B 13/18 | (2006.01) |
| G08B 21/18 | (2006.01) |
| G01K 1/02 | (2006.01) |
| H01L 41/113 | (2006.01) |
| G01D 21/00 | (2006.01) |
| H02N 2/18 | (2006.01) |
| G01P 15/02 | (2013.01) |
| G01K 5/72 | (2006.01) |

(52) U.S. Cl.
CPC ........... *G08B 21/182* (2013.01); *G01D 21/00* (2013.01); *G01K 1/024* (2013.01); *H01L 41/113* (2013.01); *H02N 2/18* (2013.01); *G01K 5/72* (2013.01); *G01P 15/02* (2013.01)

(58) Field of Classification Search
CPC ..... G08B 13/02; G08B 13/14; G08B 13/1436
USPC ...................................... 340/545.4
See application file for complete search history.

(56) References Cited

U.S. PATENT DOCUMENTS

| 4,048,526 A * | 9/1977 | Taylor ..................... G01P 13/00 |
| | | 310/329 |
| 5,952,870 A | 9/1999 | Urban |
| 6,259,292 B1 | 7/2001 | Congdon |
| 6,310,497 B1 | 10/2001 | Strauss |

(Continued)

FOREIGN PATENT DOCUMENTS

| EP | 0549519 A1 | 6/1993 |
| EP | 1317056 A2 | 6/2003 |

(Continued)

OTHER PUBLICATIONS

INPI Search Report and Written Opinion for FR 1562409 dated Aug. 2, 2016 (7 pages).

*Primary Examiner* — Kevin Kim
(74) *Attorney, Agent, or Firm* — Crowe & Dunlevy

(57) ABSTRACT

A detector of an event includes an electrical energy generator formed by a flexible piezoelectric element with a weight fastened to the flexible piezoelectric element that is biased with the weight in a position with the piezoelectric element flexed. In response to detection of the event, a trigger releases the weight so as to cause a vibration of the piezoelectric element. This vibration is converted by the flexible piezoelectric element into electrical energy. An electronic system is power by the electrical energy and is operable to generate an electrical signal indicative of the detected event.

25 Claims, 2 Drawing Sheets

(56) References Cited

U.S. PATENT DOCUMENTS

| | | |
|---|---|---|
| 7,005,778 B2 | 2/2006 | Pistor |
| 7,105,982 B1 | 9/2006 | Hagood, IV et al. |
| 2005/0184761 A1 | 8/2005 | Isomura |
| 2010/0076714 A1 | 3/2010 | Discenzo |
| 2012/0180568 A1* | 7/2012 | Koyama .................. G01P 1/023 73/579 |
| 2012/0211684 A1 | 8/2012 | Zlatintsis |
| 2013/0066594 A1 | 3/2013 | Ludlow et al. |

FOREIGN PATENT DOCUMENTS

| | | |
|---|---|---|
| EP | 2323015 A2 | 5/2011 |
| GB | 1134230 A | 11/1968 |

\* cited by examiner

EVENT DETECTOR

PRIORITY CLAIM

This application claims priority from French Application for Patent No. 1562409 filed Dec. 15, 2015, the disclosure of which is incorporated by reference.

TECHNICAL FIELD

Embodiments of the invention relate to event detectors, for example heat detectors or shock detectors, although these examples are not limiting; and more particularly, to a contactless, batteryless autonomous event detector, in particular one based on mechanical energy storage.

BACKGROUND

The purpose of an event detector is generally to indicate the occurrence of a given event, such as smoke, heat, movement, light or shock.

Generally, an event detector of this type requires a power source, such as batteries, to supply an electronic module configured to generate an alarm signal, for example an acoustic and/or light signal, in the presence of the event. It is therefore always necessary to manage the life of the power source, which may cause problems.

SUMMARY

In one embodiment, therefore, a batteryless autonomous event detector is proposed, based on mechanical energy storage. Energy generation is performed on a one-off basis by conversion of the stored mechanical energy on the occurrence of the event to be detected. The detector signal is also delivered, wirelessly for example, to a receiving node connected, for example, to a central action network such as a fire brigade center.

According to one aspect, an event detector is proposed, comprising: an electrical energy generator, including a flexible piezoelectric element and a weight fastened to the element; a trigger having a first configuration in which the trigger is configured to keep the weight in an initial position with the piezoelectric element flexed, and a second configuration in which the trigger, in response to said event, is configured to release the weight so as to cause a vibration of the piezoelectric element and enable electrical energy to be generated; and an electronic system coupled to the generator and configured to convert the electrical energy delivered by the generator into at least one electrical signal.

According to one embodiment, the event to be detected is the crossing of a temperature threshold in one or other direction.

The event detector may comprise a chassis, for example, and the trigger may include at least one part which is deformable as a function of the temperature, the deformable part being fixed to the chassis and configured to be sufficiently deformed when the temperature crosses the temperature threshold, so as to place the trigger in its second configuration and enable the weight to be released.

Additionally, the deformable part may comprise a bimetallic strip, for example. Said temperature threshold may advantageously be determined by the critical temperature of the bimetallic strip.

This detector may advantageously be used as a fire detector.

According to another embodiment, the event to be detected is a threshold shock level on the detector.

The trigger may comprise a chassis, and the trigger may comprise a retaining element fixed to the chassis, configured to retain the weight in said initial position and release it in the presence of a shock on the chassis at the threshold shock level.

This shock detector may be widely used in home automation, motor vehicle and equipment storage applications, and for detecting an intrusion into a vehicle or room.

The electronic system may also comprise, for example, a storage means configured to store the electrical energy delivered by the generator and an electronic circuit supplied by the storage means and configured to deliver said at least one electrical signal.

The electronic system may advantageously comprise an interface, for example a wireless interface (Wi-Fi, or NFC ("Near Field Communication")) linked to a communications network such as the internet.

A wireless interface enables event detectors to be moved and installed easily in desired locations.

BRIEF DESCRIPTION OF THE DRAWINGS

Other advantages and characteristics of the invention will be evident from an examination of the detailed description of embodiments, which are not limiting in any way, and the appended drawings, in which.

DETAILED DESCRIPTION

Figure 1:
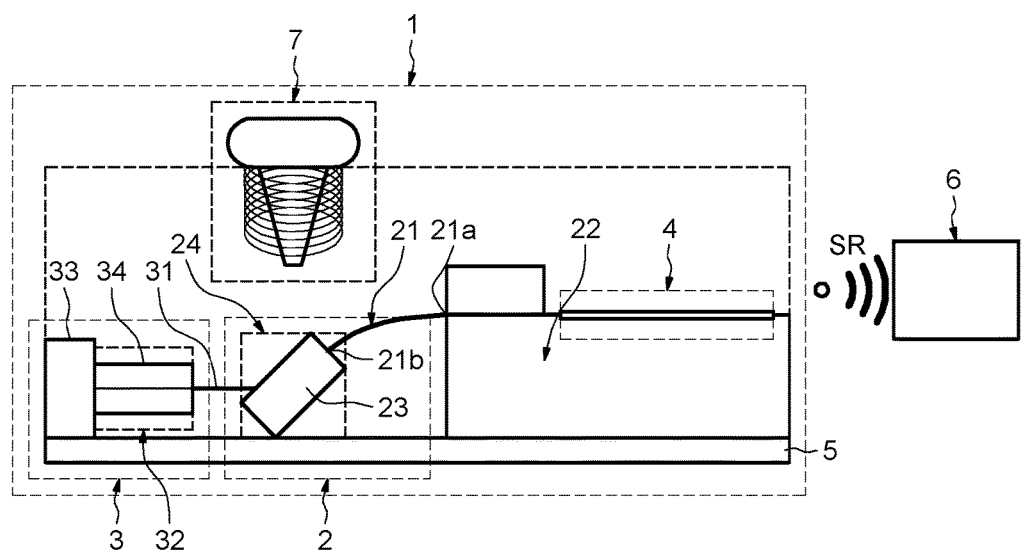
FIGS. 1 to 4 show in a schematic way some aspects of the invention.

FIG. 1 shows schematically an event detector, in this case a heat detector 1, comprising an electrical energy generator 2, a flexible trigger 3, an electrical system 4 and a chassis 5. A receiving node 6 for receiving the alarm signal delivered by the detector 1 via a wireless connection is also shown in FIG. 1.

The electrical energy generator 2 comprises a flexible piezoelectric element 21, one end 21a of which is fixed to a rigid block 22 fastened to the chassis 5, and an oscillating weight 23 fastened to a second end 21b located opposite the first end 21a.

The piezoelectric element 21 is torsionally deformable to enable the oscillating weight 23 to reach at least one initial position 24 in which the generator 2 can store energy in mechanical form, that is to say potential energy.

Additionally, given the intrinsic characteristics of the piezoelectric element 21, the electrical energy generator 2 can be used to convert the stored mechanical energy into electrical energy for delivery to the electrical system 4 when the generator 2 is triggered by the trigger 3.

The trigger 3 comprises a catch 31 and a deformable part 32 coupled between a rigid base 33 fastened to the chassis 5 and the catch 31.

Here, in the case of the heat detector, the deformable part 32 comprises a bimetallic strip 34 including two different metal plates, each having a different coefficient of expansion, glued to one another. The bimetallic strip 34 is therefore deformed with a variation in temperature.

It should be noted that the temperature detection threshold of the detector 1 is necessarily determined by the critical temperature of the bimetallic strip 34.

The trigger 3 has a first configuration and a second configuration.

In the first configuration, the trigger 3 is configured to retain the oscillating weight 23 in its initial position 24 by means of the catch 31.

In the second configuration, the trigger 3 is configured to release the oscillating weight 23 from the initial position 24, when the temperature threshold is crossed, so as to initiate a cycle of mechanical vibration which can be converted to electrical energy by the piezoelectric element 21.

The electronic system 4 of the detector 1 is fixed to the rigid block 22 and coupled electrically to the piezoelectric element 21 so as to receive and use the electrical energy converted by the electrical energy generator 2.

As described in greater detail below, the electronic system 4 is configured to convert the electrical energy delivered by the generator 2 into at least one electrical signal SE, and then, in this example, into a radio frequency alarm signal SR.

Advantageously, the electrical signal SE delivered by the electronic system 4 comprises a data frame intended to be captured by an external receiving node 6 which is permanently operational and connected to an alarm network, so that action can be taken in response to the triggering of the alarm, including, for example, a warning on a mobile phone, or a call to a fire brigade, specifying full details of the position of the room in which the detector 1 is installed.

The detector 1 further comprises a resetter 7, located for example above the oscillating weight 23, and configured to replace the weight 23 in the initial position 24 after each triggering of the generator 2.

Figure 2:
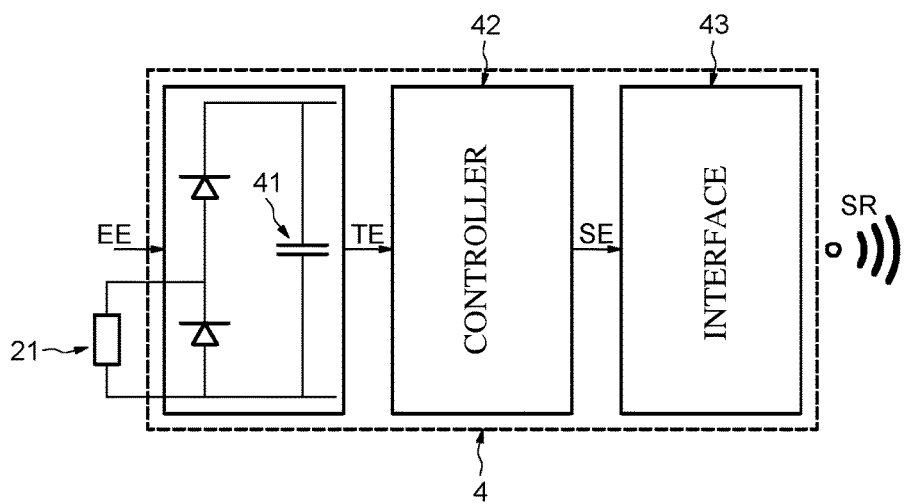

Reference will now be made to FIG. 2, to illustrate an example of the internal structure of the electronic system 4. This comprises:

a storage means 41 comprising at least one storage capacitor connected to the piezoelectric element and configured to store the electrical energy EE delivered by the generator 2;

an electronic circuit 42 supplied by the storage means 41 and configured to compare the voltage TE of said at least one storage capacitor with a threshold input voltage so as to deliver at least an electrical alarm signal SE if the voltage TE of said at least one capacitor is greater than the threshold input voltage; the electronic circuit 42 may comprise a microcontroller intended to deliver said at least one electrical signal SE which comprises said frame intended to be captured by the receiving node 6; and an interface 43 supplied by the electronic circuit 42 and configured to deliver said at least one electrical alarm signal SR to the outside of the detector 1.

For greater simplicity and freedom of installation of the detector 1, the interface 43 is advantageously a wireless interface, for example one of the Wi-Fi, IEEE 802.15.14, BLE ("Bluetooth Low Energy"), or other type, capable of communicating with the receiving node 6 and thus connecting to the internet via the receiving node 6. The interface may also be of the contactless type known as NFC (for "Near Field Communication").

The signal delivered by the interface 43 at the output of the electronic system 4 is then a radio frequency signal SR. Evidently, a wired interface could also be used to deliver the electrical alarm signal SE.

It should be noted that the electronic circuit 42 requires no power supply other than the voltage TE delivered by said at least one storage capacitor 41 for its operation, once this voltage TE has exceeded said threshold voltage.

Additionally, the electrical energy EE delivered at the end of a mechanical vibration cycle of the piezoelectric element 21 after the triggering of the detector 1 is sufficient to reach said voltage threshold.

Figure 3:
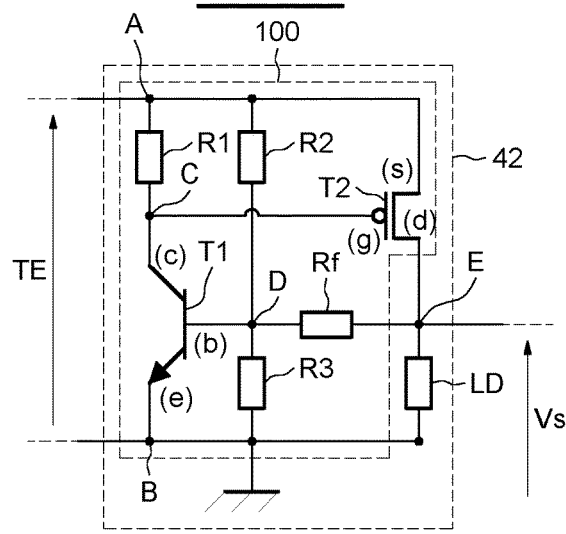

For this purpose, the electronic circuit 42 may comprise, for example, a circuit for comparing a voltage with a threshold, of the type described in French Application for Patent No. 1462427, an embodiment of which is recalled here with reference to FIG. 3.

The comparison circuit 100 of FIG. 3 comprises a first branch including a resistor R1 and a transistor T1 in series between the nodes A and B to which is applied an input voltage, in this case the voltage TE delivered by said at least one storage capacitor 41. More particularly, in the illustrated example, the resistor R1 has a first end connected to the node A and a second end connected to a node C, and the transistor T1 has a first conduction node connected to the node C and a second conduction node connected to the node B. In the illustrated example, the transistor T1 is an NPN-type bipolar transistor whose collector (c) is connected to the node C and whose emitter (e) is connected to the node B.

The circuit 100 further comprises a second branch, parallel to the first branch, including two resistors R2 and R3 in series between the nodes A and B. More particularly, in the illustrated example, the resistor R2 has a first end connected to the node A and a second end connected to a node D, and the resistor R3 has a first end connected to the node D and a second end connected to the node B. The resistors R2 and R3 form a voltage divider bridge. The node D, or the mid-point of the divider bridge, is connected to a control node of the transistor T1, namely the base (b) of the transistor T1 in the illustrated example.

The circuit 100 further comprises a third branch, comprising a transistor T2 in series with a resistive element Rf between the node A and the node D. More particularly, in the illustrated example, the resistor Rf has a first end connected to the node D and a second end connected to a node E, and the transistor T2 has a first conduction node connected to the node E and a second conduction node connected to the node A. In the illustrated example, the transistor T2 is a P-channel MOS transistor whose source (s) is connected to the node A and whose drain (d) is connected to the node E. A control node of the transistor T2, namely its gate (g) in this example, is connected to the node C.

The nodes E and B are nodes for supplying an output voltage Vs of the circuit 100. A load LD to be supplied, for example a wireless connection interface, such as said interface 43, is connected between the nodes E and B of the circuit 100.

The operation of the circuit 100 is as follows. When the input voltage TE is low, the voltage at the terminals of the resistor R3 of the divider bridge is insufficient to make the transistor T1 conduct. The transistor T1 is therefore turned off. The voltage at the terminals of the resistor R1, corresponding to the gate-source voltage of the transistor T2 in this example, is then substantially zero. The transistor T2 is therefore turned off. The current flowing through the load LD is then substantially zero, and the load LD is not supplied. The output voltage Vs of the circuit 100 is then approximately zero.

The resistive element Rf then contributes to the lowering of the potential of the node D, bringing it closer to that of the node E (which is then substantially equal to that of the node B), and therefore reinforces the non-conducting state of the transistor T1.

If the voltage TE increases until it crosses a threshold $V_{SH}$, the voltage at the terminals of the resistor R3 reaches the threshold for making the transistor T1 conduct. The transistor T1 then becomes conducting, and a current flows in the branch comprising the resistor R1 and the transistor T1. The voltage at the terminals of the resistor R1, or the gate-source voltage of the transistor T2 in this example, then increases until it reaches the threshold for making the transistor T2 conduct. The transistor T2 therefore also becomes conducting. The load LD is then supplied, and the output voltage Vs of the circuit 100 becomes substantially equal to the input voltage TE (with the deduction of the voltage drop of the transistor T2). The resistive element Rf then tends to raise the potential of the node D again, bringing it closer to that of the node E (which is then substantially equal to that of the node A), and therefore helps to maintain the conductive state of the transistor T1.

If the voltage TE falls back below a threshold $V_{SB}$ which is lower than the threshold $V_{SH}$, the voltage at the terminals of the resistor R3 is no longer sufficient to keep the transistor T1 in the conductive state. The transistor T1 therefore becomes non-conducting, and the voltage at the terminals of the resistor R1 becomes substantially zero, causing the transistor T2 to become non-conducting. Consequently the load LD is no longer supplied, and the output voltage Vs of the circuit 100 becomes substantially zero.

The presence of the resistor Rf, or feedback resistor, between the nodes D and E causes the circuit 100 to operate with hysteresis; that is to say, its threshold $V_{SH}$ for switching from the non-conducting state (Vs~0) to the conducting state (Vs~Ve) is above the threshold $V_{SB}$ for switching from the conducting state to the non-conducting state. This makes it possible to avoid undesirable oscillation between the supplied and non-supplied modes of the load LD, notably in the case where switching from the non-conducting to the conducting state is accompanied by a high current demand in the load LD.

Figure 4:
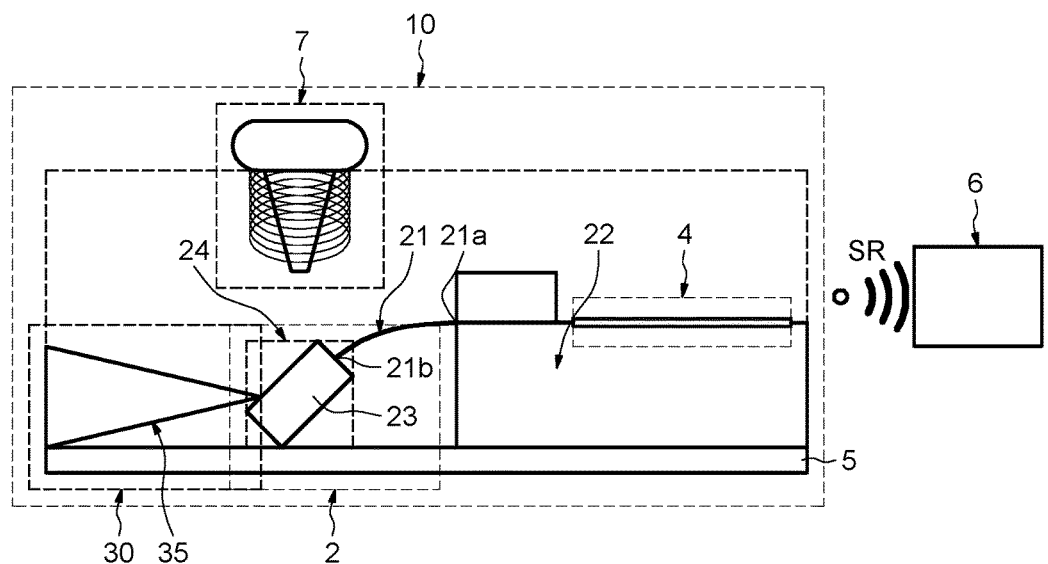

Reference will now be made more particularly to FIG. 4, for the description of another embodiment in which the event to be detected is a threshold shock level on the shock detector 10.

The shock detector 10 comprises the same electrical energy generator 2, the same electrical system 4 and the same chassis 5 as the heat detector 1 described in greater detail above.

In this variant, the shock detector 10 comprises a trigger 30 including a retaining element 35 fixed to the chassis 5 and configured to retain the oscillating weight 23 of the generator 2 in said initial position 24.

The shape of the retaining element 35 is specially designed, for example in the form of a cone as shown in FIG. 3, as is its positioning on the weight 23, so as to retain the weight 23 while also being sensitive to shocks on the shock detector 10.

If the shock applied to the shock detector 10 crosses a threshold shock level, the retaining element 35 moves and/or is deformed so as to release the oscillating weight 23, to deliver the radio frequency alarm signal SR to a receiving node 6, as described above for the case of the heat detector 1.

Thus it is possible to produce, for example, an autonomous batteryless event detector (1, 10) having a one-off power source based on storage of mechanical energy, and making it possible to deliver, in response to said event, an electrical alarm signal SE, which if appropriate may be a radio frequency signal SR captured by a receiving node 6 and triggering a warning on a connected network.

The invention claimed is:

1. An event detector, comprising:
an electrical energy generator including a flexible piezoelectric element and a weight fastened to the flexible piezoelectric element;
a chassis;
a catch or a retaining element mounted to the chassis and movable between a first position and a second position, the catch or retaining element in the first position keeping the weight in an initial position with the piezoelectric element flexed and the catch or retaining element moving to the second position, in response to a detected event, to release the flexed piezoelectric element and cause a vibration of the piezoelectric element to enable generation of electrical energy by the electrical energy generator; and
an electronic system coupled to the electrical energy generator and configured to convert the electrical energy generated by the generator into at least one electrical signal indicative of said detected event.

2. The detector according to claim 1, wherein the detected event is a crossing of a temperature threshold.

3. The detector according to claim 2, wherein the catch or retaining element includes at least one part which is deformable as a function of the temperature, said at least one part being fixed to the chassis and configured to be sufficiently deformed when a temperature crosses the temperature threshold so as to place the catch or retaining element in its second configuration for releasing the flexed piezoelectric element.

4. The detector according to claim 3, wherein the at least one part comprises a bimetallic strip.

5. The detector according to claim 1, wherein the detected event is a shock exceeding a threshold shock level.

6. The detector according to claim 5, the catch or retaining element releases the flexed piezoelectric element in response to the shock on the chassis at the threshold shock level.

7. The detector according to claim 1, wherein the electronic system comprises a storage circuit configured to store the electrical energy delivered by the electrical energy generator and an electronic circuit supplied by the storage circuit and configured to deliver said at least one electrical signal.

8. The detector according to claim 7, wherein the electronic system further comprises an interface configured to deliver the at least one electrical signal outside the detector.

9. The detector according to claim 8, wherein the interface is a wireless interface.

10. An apparatus, comprising:
an electrical energy generator including a flexible piezoelectric element and a weight fastened to the flexible piezoelectric element;
means for biasing said weight in a position with the piezoelectric element flexed;
a detector of an event, said detector responding to detection of the event by releasing said means for biasing to permit vibration of the piezoelectric element and the generation of electrical energy from the vibrating piezoelectric element; and
a signal generator powered by said electrical energy to generate an electrical signal indicative of the detected event.

11. The apparatus of claim 10, further comprising radio interface configured to convert the electrical signal into a radio signal indicative of the detected event.

12. The apparatus of claim 10, wherein the event is a temperature event.

13. The apparatus of claim 10, wherein the event is a shock event.

14. The apparatus of claim 10, further comprising means for resetting said means for biasing said weight in the position with the piezoelectric element flexed.

15. An event detector, comprising:
   an electrical energy generator including a flexible piezoelectric element and a weight fastened to the flexible piezoelectric element;
   a trigger having a first configuration to keep the weight in an initial position with the piezoelectric element flexed and having a second configuration, in response to a detected event, to release the weight so as to cause a vibration of the piezoelectric element and enable generation of electrical energy by the electrical energy generator, wherein the detected event is a crossing of a temperature threshold; and
   an electronic system coupled to the electrical energy generator and configured to convert the electrical energy generated by the generator into at least one electrical signal indicative of said detected event.

16. The event detector of claim 15, further comprising a chassis and wherein the trigger includes at least one part which is deformable as a function of the temperature, said at least one part being fixed to the chassis and configured to be sufficiently deformed when a temperature crosses the temperature threshold so as to place the trigger in its second configuration for releasing the weight.

17. The event detector of claim 16, wherein the at least one part comprises a bimetallic strip.

18. An event detector, comprising:
   an electrical energy generator including a flexible piezoelectric element and a weight fastened to the flexible piezoelectric element;
   a trigger having a first configuration to keep the weight in an initial position with the piezoelectric element flexed and having a second configuration, in response to a detected event, to release the weight so as to cause a vibration of the piezoelectric element and enable generation of electrical energy by the electrical energy generator; and
   an electronic system coupled to the electrical energy generator and configured to convert the electrical energy generated by the generator into at least one electrical signal indicative of said detected event, wherein the electronic system comprises a storage circuit configured to store the electrical energy delivered by the electrical energy generator and an electronic circuit supplied by the storage circuit and configured to deliver said at least one electrical signal.

19. The event detector of claim 18, wherein the electronic system further comprises an interface configured to deliver the at least one electrical signal outside the detector.

20. The event detector of claim 19, wherein the interface is a wireless interface.

21. The event detector of claim 18, wherein the detected event is a crossing of a temperature threshold.

22. The event detector of claim 21, further comprising a chassis and wherein the trigger includes at least one part which is deformable as a function of the temperature, said at least one part being fixed to the chassis and configured to be sufficiently deformed when a temperature crosses the temperature threshold so as to place the trigger in its second configuration for releasing the weight.

23. The event detector of claim 22, wherein the at least one part comprises a bimetallic strip.

24. The event detector of claim 18, wherein the detected event is a shock exceeding a threshold shock level.

25. The event detector of claim 24, further comprising a chassis and wherein the trigger comprises a retaining element fixed to the chassis and configured to retain the weight in said initial position and release the weight in response to the shock on the chassis at the threshold shock level.

* * * * *